United States Patent [19]

Hernandez et al.

[11] Patent Number: 5,548,524
[45] Date of Patent: Aug. 20, 1996

[54] EXPRESSION PROMOTION FOR HIERARCHICAL NETLISTING

[75] Inventors: Celimo P. Hernandez, San Jose; Robyn D. Coultas, Atherton, both of Calif.

[73] Assignee: Cadence Design Systems, Inc., San Jose, Calif.

[21] Appl. No.: 223,924

[22] Filed: Apr. 6, 1994

[51] Int. Cl.⁶ ............................................ G06F 17/50
[52] U.S. Cl. ............................ 364/489; 364/488
[58] Field of Search .......................... 364/485, 489, 364/490, 491, 578; 395/600, 500

[56] References Cited

U.S. PATENT DOCUMENTS

| | | | |
|---|---|---|---|
| 4,831,543 | 5/1989 | Mastellone | 364/489 |
| 4,967,367 | 10/1990 | Piednoir | 364/489 |
| 5,029,102 | 7/1991 | Drumm et al. | 364/489 |
| 5,150,308 | 9/1992 | Hooper et al. | 364/489 |
| 5,210,699 | 5/1993 | Harrington | 364/488 |
| 5,212,650 | 5/1993 | Hooper et al. | 364/489 |
| 5,247,468 | 9/1993 | Henrichs et al. | 364/578 |
| 5,262,959 | 11/1993 | Chkoreff | 364/489 |
| 5,278,769 | 1/1994 | Bair et al. | 364/490 |
| 5,301,318 | 4/1994 | Mittal | 364/489 |
| 5,384,710 | 1/1995 | Lam et al. | 364/489 |

Primary Examiner—Vincent N. Trans
Attorney, Agent, or Firm—Townsend and Townsend and Crew LLP

[57] ABSTRACT

A method for generating hierarchical netlists for gate level or transistor level circuits having instances with properties defined by algebraic expressions. The present invention avoids duplication of instance definitions using a method of expression promotion in a computer aided design system capable of simple parameter passing, whereby expressions are replaced by tokens in the netlist, and moved up the hierarchy to a level where they can be fully evaluated. The present invention also provides a specific embodiment for implementing the expression promotion method used for netlisting.

6 Claims, 7 Drawing Sheets

FIG. 1A

```
*****************
*    NETLIST    *
*****************

1    .SUBCKT   BOTTOM_MOST_CELL        <--- HEADER
2              R1 = R1_r
                                       <--- BODY
3              R2 = R2_r
4    .ENDS     BOTTOM_MOST_CELL        <--- FOOTER

5    .SUBCKT   BOTTOM_CELL
6              X4 = BOTTOM_MOST_CELL  R1_r = 2.0, R2_r = X4_R2_r
7              R3 = 1K
8              R4 = 2K
9    .ENDS     BOTTOM_CELL

10   .SUBCKT   MID_CELL1
11             X3 = BOTTOM_CELL    X4_R2_r = X3_X4_R2_r
12   .ENDS     MID_CELL1

13   .SUBCKT   MID_CELL2
14             R5 = 5.0
15             R6 = 15.0
16   .ENDS     MID_CELL2

17   X1 = MID_CELL1 X3_X4_R2_r = 10.0
18   X2 = MID_CELL2
19   R7 = 10K
20   R8 = 20K
```

EXPRESSION PROMOTION FOR HIERARCHICAL NETLISTING

BACKGROUND OF THE INVENTION

The present invention relates in general to computer aided design tools, and in particular to a netlisting tool that provides hierarchical netlists using a method of expression promotion.

The process of computer aided design (CAD) includes an initial step of creating a schematic diagram of the circuit to be simulated. It is to be understood that in this description, the circuit refers to transistor level as well as gate level circuits. The circuit schematic diagram is a symbolic representation of the electronic circuit and is typically hierarchical in design. Upon entering the schematic into the computer, including circuit component parameters, the computer performs what is referred to as schematic capture or netlisting. Netlisting usually encompasses the traversal of a hierarchical design database to generate a textual or binary representation of the design. The netlist is subsequently read by a simulator that performs circuit simulation.

To minimize the size of the netlist, it is desirable to maintain the circuit hierarchy structure in the textual or binary representation. To facilitate hierarchical representation, many CAD tools available today provide for parameter passing. Parameter passing allows the use of arguments in defining sub-circuits or "macros," typically as property values for individual components in the macro. Once defined, the same macro may be used in several different instances at the same or different levels of the circuit hierarchy. During the netlist read-in phase, the hierarchical netlist is flattened such that each call to a macro results in a unique set of components. Any component whose property values were defined by macro arguments will have those values reflected as the property values of the unique, flattened component.

Since this methodology requires the flattening of the hierarchy, such parameter passing often has been limited to passing of simple numeric parameters as arguments to macro calls. More advanced CAD tools now allow the user to define circuit component property values with algebraic expressions. These algebraic expressions may contain variables that are defined at different levels of hierarchy. For these tools, maintaining the hierarchy in the representation gives rise to several practical problems. To process algebraic expressions, the tool would have to be capable of fully evaluating algebraic expressions upon flattening the netlist to generate a numeric value for each component property. Typical CAD tools, however, provide simulators that can only evaluate the most fundamental forms of expressions. More complex expressions, with potential calls to arbitrary mathematical functions or user-defined functions, cannot be evaluated unless the simulator has these functions defined in the evaluation environment. For a truly general case, this is simply not feasible.

An alternative approach requires that the netlisting environment contain all function definitions such that algebraic expressions can be evaluated upon netlist creation. Using this approach, the netlist provided to the simulator has only numeric component property values and no further evaluation is necessary. This, however, places the responsibility on the tool that does the parameter substitutions and expression evaluation (i.e., netlister) to also insure that a unique set of components be created. The netlister is therefore required to textually duplicate a macro definition each time the macro is referenced with a different set of calling parameters. For highly parametric designs, this flattening process leads to unduly large textual or binary representations, rendering the approach impractical for large digital designs.

There is therefore a need for a netlisting tool that provides for passing of design parameters into a given level of hierarchy for use in algebraic expressions defining circuit component properties.

SUMMARY OF THE INVENTION

The present invention is a computer aided design tool that provides a netlister capable of passing parameters between different levels of hierarchy for use in algebraic expressions. The present invention is based on a novel method of "expression promotion" that eliminates the need for flattening the entire hierarchical netlist database during netlisting. Expressions are promoted up through the hierarchy to a high enough level where they can be fully evaluated. The netlist generated by this method need only contain numeric parameters as macro arguments. Therefore, no macro definition duplication (flattening) is required during the netlisting process.

Broadly, the present invention provides in a computer aided design system capable of simple parameter passing, a method for generating a hierarchical netlist for a circuit schematic that is hierarchically diagramed from a lowest (leaf) level to a top level. The expression promotion method of the present invention starts at the leaf level and identifies all components having property values defined by algebraic expressions which contain references to variables defined at a higher level in the hierarchy. All occurrences of such algebraic expressions are gathered in a list, and a macro argument token is dropped in place of each algebraic expression in a line in the hierarchical netlist. The token identifies an associated member of the list. Next, the netlister moves up the hierarchy to a parent level above the leaf level, and repeats the process of gathering expressions and replacing them with argument tokens. An expression is evaluated once it reaches a hierarchy level where no references are made to a variable on a higher level of hierarchy. This process is repeated until netlisting is complete. At this point all expressions have been promoted up the hierarchy high enough such that they can be fully evaluated. The evaluated value is then used as an actual argument value to macro calls.

A better understanding of the nature and advantages of the expression promotion method of the present invention may be had by referring to the detailed description and the diagrams below.

DESCRIPTION OF THE SPECIFIC EMBODIMENTS

Figure 1A:
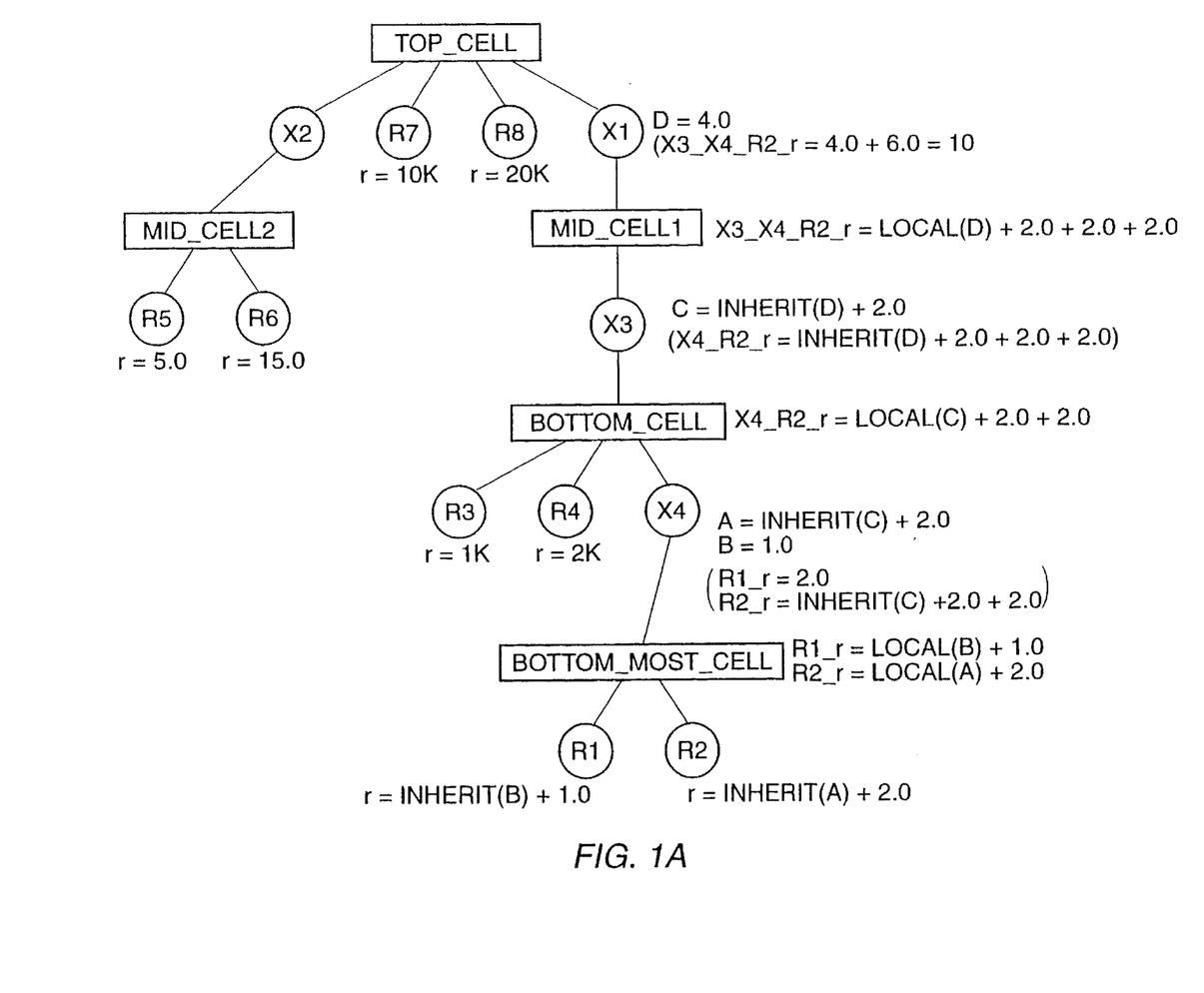
FIGS. 1A and 1B show an exemplary graphical design database and its corresponding netlist generated according to the present invention, respectively.
Figure 1B:
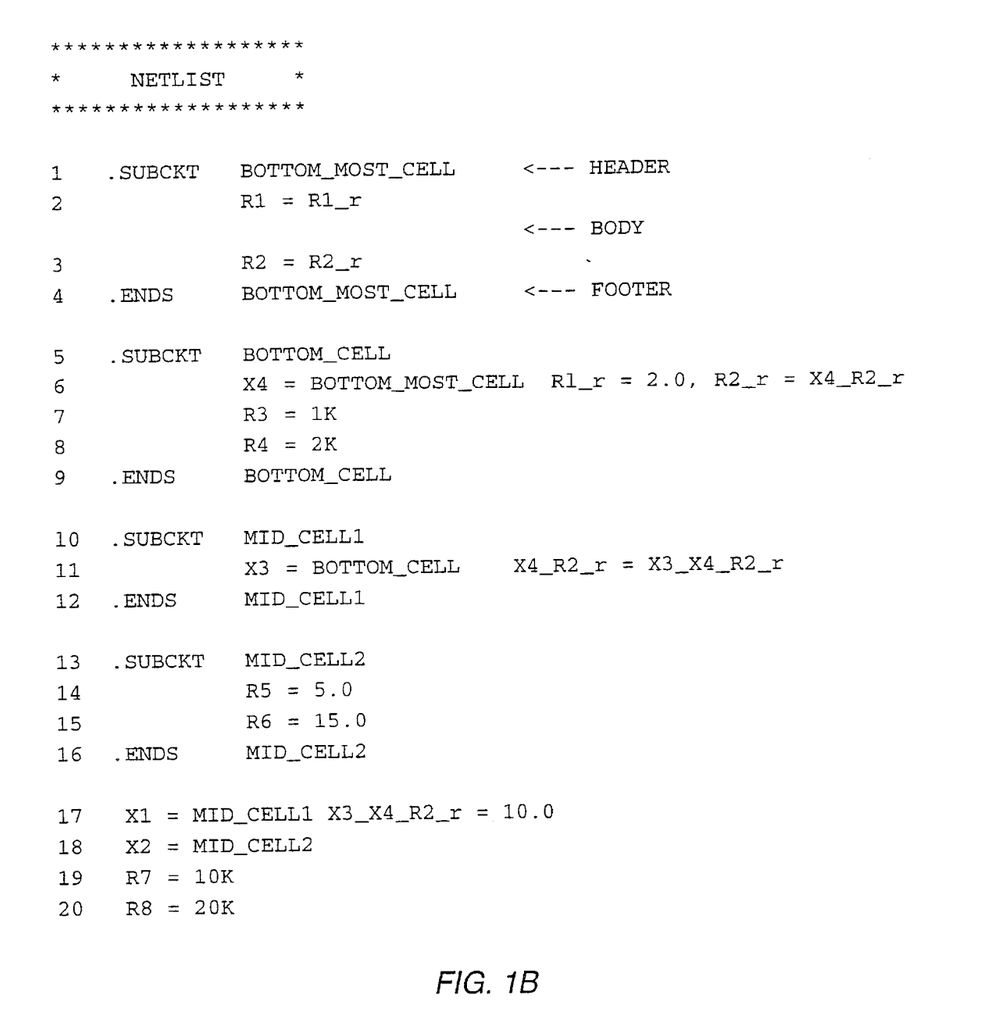

The general concept underlying the expression promotion method of the present invention is best illustrated through an example. FIGS. 1A and 1B show a simple example of a graphical design database and a corresponding netlist derived based on the expression promotion method of the present invention, respectively. The circuit example shown in FIG. 1A includes four levels of hierarchy with a TOP_CELL 100 at the top (or root) level, MID_CELL1 102 and MID_CELL2 104 at a second level, BOTTOM_CELL 106 at a third level, and BOTTOM_MOST_CELL 108 at the fourth and the final (or leaf) level.

The netlister of the present invention starts from the leaf level, in this case BOTTOM_MOST_CELL 108 which defines a sub-circuit X4. BOTTOM_MOST_CELL 108 includes two components (resistors) R1 and R2 both of which are primitives with property values r defined by an algebraic expression:

R1: *r=INHERIT(B)+1.0*

R2: *r=INHERIT(A)+2.0*

The terminology INHERIT(A) and INHERIT(B) denote variables whose values will be determined once the netlister reaches a higher hierarchical level where the values for A and B are defined. Since both algebraic expressions contain variables that refer to the next level up in the hierarchy, neither one can be evaluated at this time. The netlister then replaces each expression with an argument token, R1_r for R1 and R2_r for R2, and ends the sub-circuit definition. This is shown on lines 1 through 4 of the netlist shown in FIG. 1B.

Next, the netlister moves one level up to BOTTOM_CELL 106. BOTTOM CELL 106 includes three components, two primitives R3 and R4 and a sub-circuit X4. Primitives R3 and R4 have properties with defined numerical values (R3: r=1K and R4: r=2K). Sub-circuit X4 includes the two properties A and B that are used in the algebraic expressions defining the properties of R1 and R2. Property B of sub-circuit X4 has a numeric value of 1.0 and property A is defined by the expression [INHERIT(C)+2.0]. At this point, the argument token R1_r can be fully evaluated since the value for B is known. For the argument R2_r, the INHERIT(A) term is replaced by its local value of [INHERIT(C)+2.0], and a new token X4_R2_r defined by [INHERIT(C)+2.0+2.0] is dropped in place of parameter A. The netlister then prints the BOTTOM_CELL 106 sub-circuit definition as shown on lines 5 through 9 of the netlist of FIG. 1B.

The netlister next moves one level higher to MID_CELL1 102. MID_CELL1 102 includes only one component, a sub-circuit X3. Sub-circuit X3 provides the definition for variable C=INHERIT(D)+2.0. The netlister replaces the INHERIT(C) term in the expression for X4_R2_r with its local value of [INHERIT(D)+2.0], and drops a token X3_X4_R2_r defined by [INHERIT(D)+2.0+2.0+2.0] in place of parameter C. The sub-circuit definition for MID_CELL1 102 is printed on lines 10 through 12 of the netlist of FIG. 1B.

The rest of the netlist in FIG. 1B includes a sub-circuit definition for MID_CELL2 104 which includes two primitives R5 and R6 with numerical parameter values, and the four components of TOP_CELL 100. Of the four components of TOP_CELL 100, two are primitives R7 and R8, and two are sub-circuits X1 and X2. The two primitives R7 and R8 have numerical property values which are printed directly in the netlist. Sub-circuit X1 includes a parameter D which is defined by a numerical value of 4.0. At this point, all expressions can be fully evaluated. The value for the argument token X3_X4_R2_r defined by [INHERIT(D)+ 2.0+2.0+2.0] equals 10.0 as shown on line 17 of the netlist of FIG. 1B.

The above example illustrates the "bubbling up" or promotion of expressions up the hierarchy levels, using argument tokens, to a point where the expressions can be evaluated. This eliminates the need for duplication of sub-circuit or macro definitions each time a macro is referenced with a different set of calling parameters. The resulting netlist shown in FIG. 1B is therefore very compact. FIG. 1A shows a simple example of a hierarchical circuit structure for illustration purposes. The expression promotion method would operate exactly the same in case of more complex circuits structures with graphical designs having numerous branches and levels of hierarchy. The above process repeats for every branch, promoting expressions from the leaf level up through the hierarchy.

Also, this example uses a textual representation as the netlist. In CAD tools capable of combining schematic entry, netlisting and simulation in the same environment, the generated netlist may directly feed into the simulator. In that case, the netlist need not be in textual form, but instead, may have any computer language structure (i.e., binary form) comprehended by the simulator. It is to be understood that the principles of the expression promotion method of the present invention as explained above would apply to generate a netlist in any given format required by the simulator.

Figure 2:
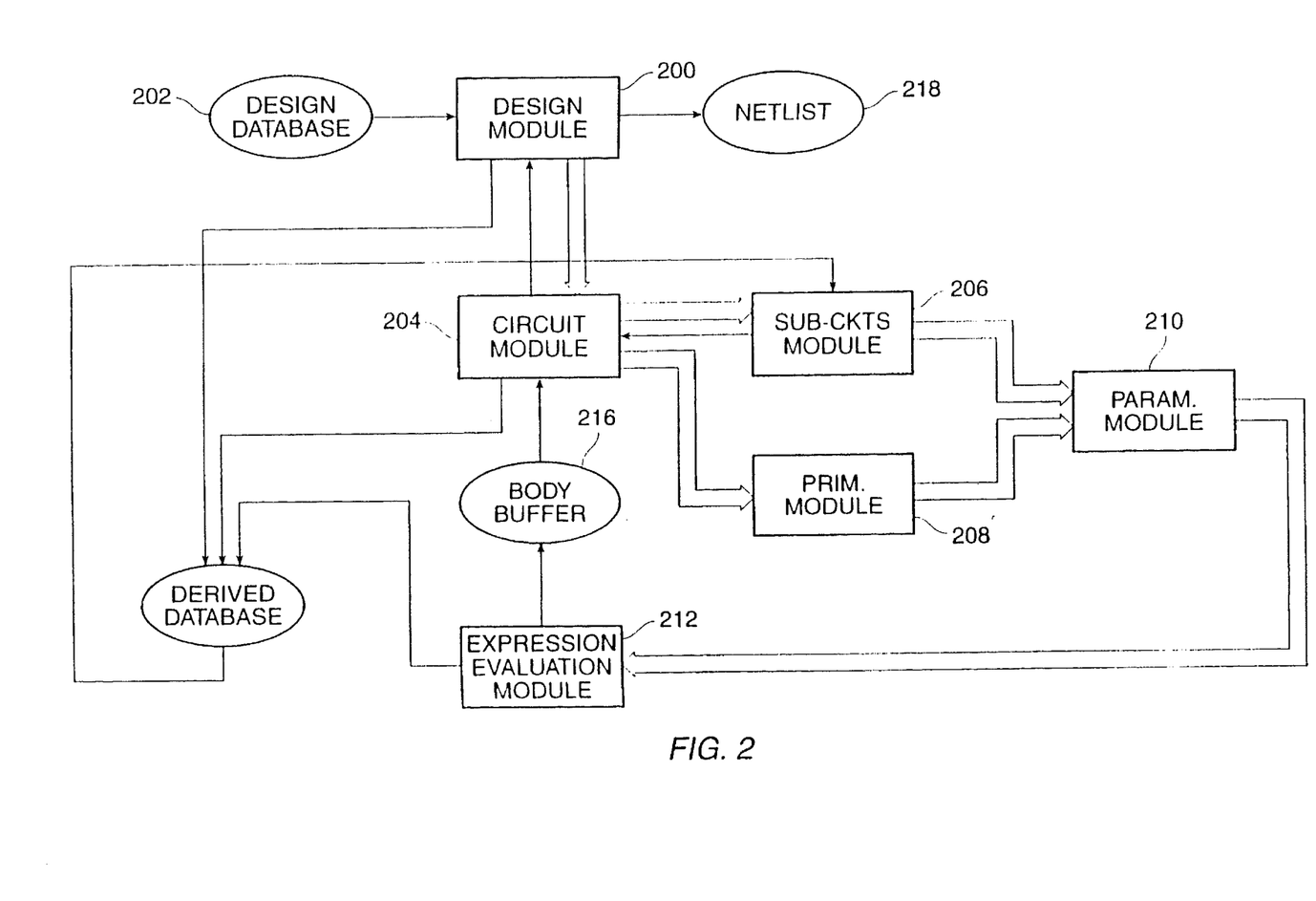
FIG. 2 shows one embodiment implementing the netlister of the present invention.

FIG. 2 shows one embodiment of a system implementing the netlister of the present invention. The embodiment shown in FIG. 2 includes several modules that cooperate with each other to generate a hierarchical netlist 218. A design module 200 receives extracted circuit data from design database 202 and with the help of a circuit module 204 generates the hierarchical netlist 218. In this implementation, circuit module 204 divides instances into two groups: primitives and sub-circuits. Referring to FIG. 1A, an example of a primitive would be any one of resistors R1 through R8, and an example of a sub-circuit would be any one X1 through X4. Circuit module 204 communicates with a sub-circuit module 306 and a primitive module 208. Both modules 206 and 208 access a parameter module 210 that generates for the netlist the parameters for primitives and sub-circuits. Once parameters are derived, an expression evaluation module 212 evaluates expressions if possible. Identifiers for the evaluated parameters are placed in a body buffer 216 that communicates with circuit module 204 for entering this information into the netlist. Evaluated parameters are stored in derived database 214 which also receives circuit database information (dBckts) from circuit module 204. This database is initialized by circuit module 200. The information stored in this database is accessed and used by sub-circuit module 206. The operation of the modules in the netlister of FIG. 2 will be described below in connection with the flow diagrams shown in FIGS. 3, 4, 5, 6, 7 and 8.

Figure 3:
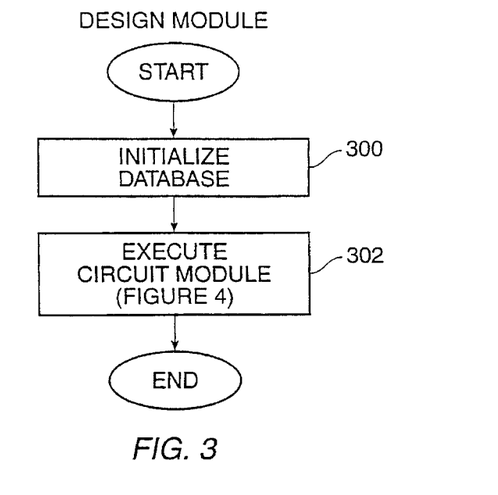
FIG. 3 is a flow diagram of a design module of the embodiment shown in FIG. 2.
Figure 4:
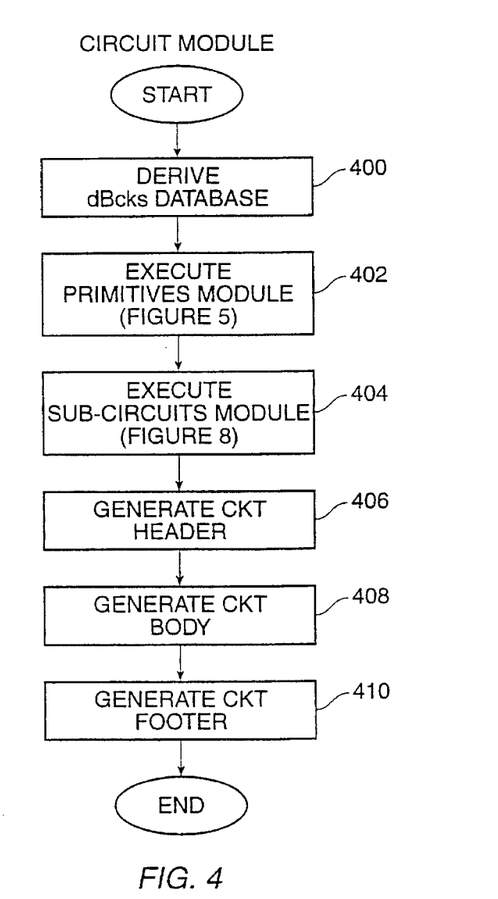
FIG. 4 is a flow diagram of a circuit module of the embodiment shown in FIG. 2.

FIG. 3 shows a flow diagram for design module 200. This module receives the extracted circuit database, initializes (step 300) derived database 214 and executes (step 302) circuit module 204 to generate the netlist 218. FIG. 4 shows a flow diagram for circuit module 204. Based on the extracted circuit database, circuit module 204 derives the dBckts database (step 400), executes primitives module 208 (step 402) and sub-circuits module 206 (step 404), generates circuit header (step 406), circuit body (step 408), and circuit footer (step 410) for the netlist 218. The output of circuit module 204 is a portion of the netlist defining a sub-circuit instance. An example is provided on lines 5 through 9 of the exemplary netlist shown in FIG. 1B.

Figure 5:
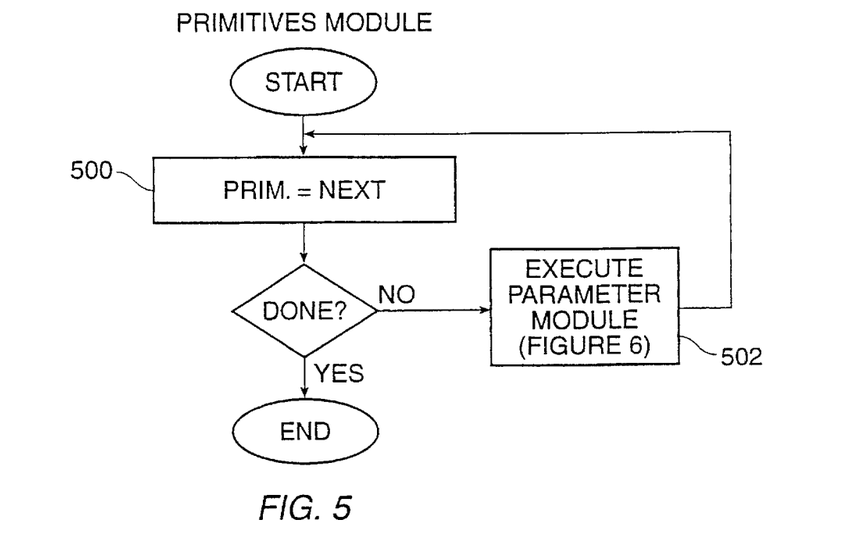
FIG. 5 is a flow diagram of a primitive module of the embodiment shown in FIG. 2.
Figure 6:
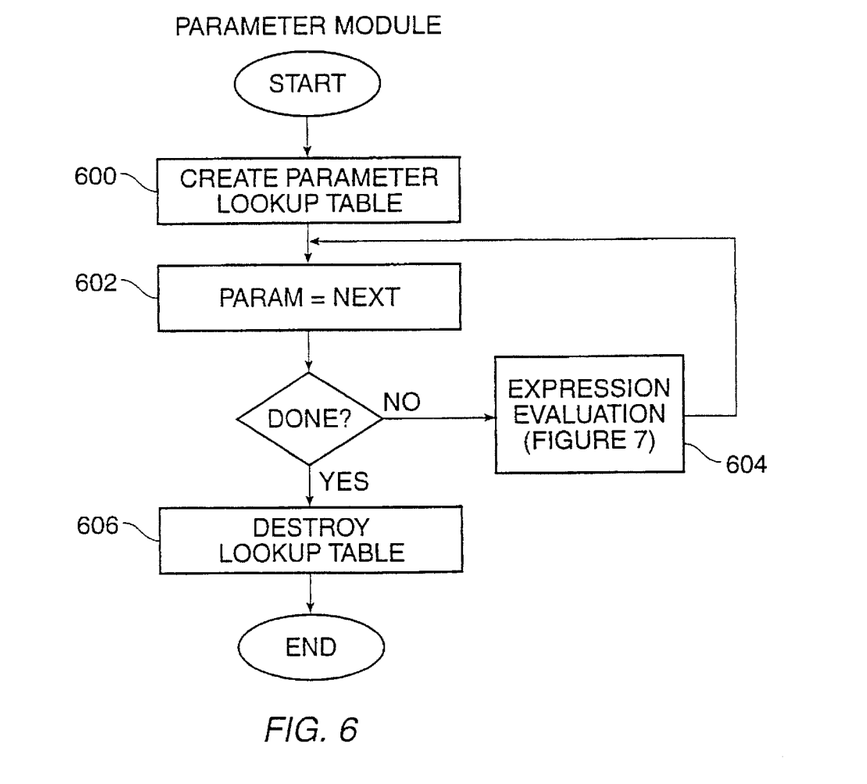
FIG. 6 is a flow diagram of a parameter module of the embodiment shown in FIG. 2.

FIG. 5 shows the flow diagram for primitives module 208. This module receives a list of primitives from circuit module 204 and goes through the list one primitive at a time (step 500) executing parameter module 210 (step 502). FIG. 6 shows the steps involved in the operation of parameter module 210. Parameter module 210 receives among other circuit information, a list of parameters to be referenced. From this list the module creates a temporary parameter lookup table (step 600). The lookup table is a sorted and indexed table of all parameters that is generated to help the parameter evaluation process run more efficiently. Next, the module goes through each parameter one at a time (step 602), executing expression evaluation module 312 (step 604). Once, all expressions are evaluated the temporary lookup table is destroyed (step 606).

Figure 7:
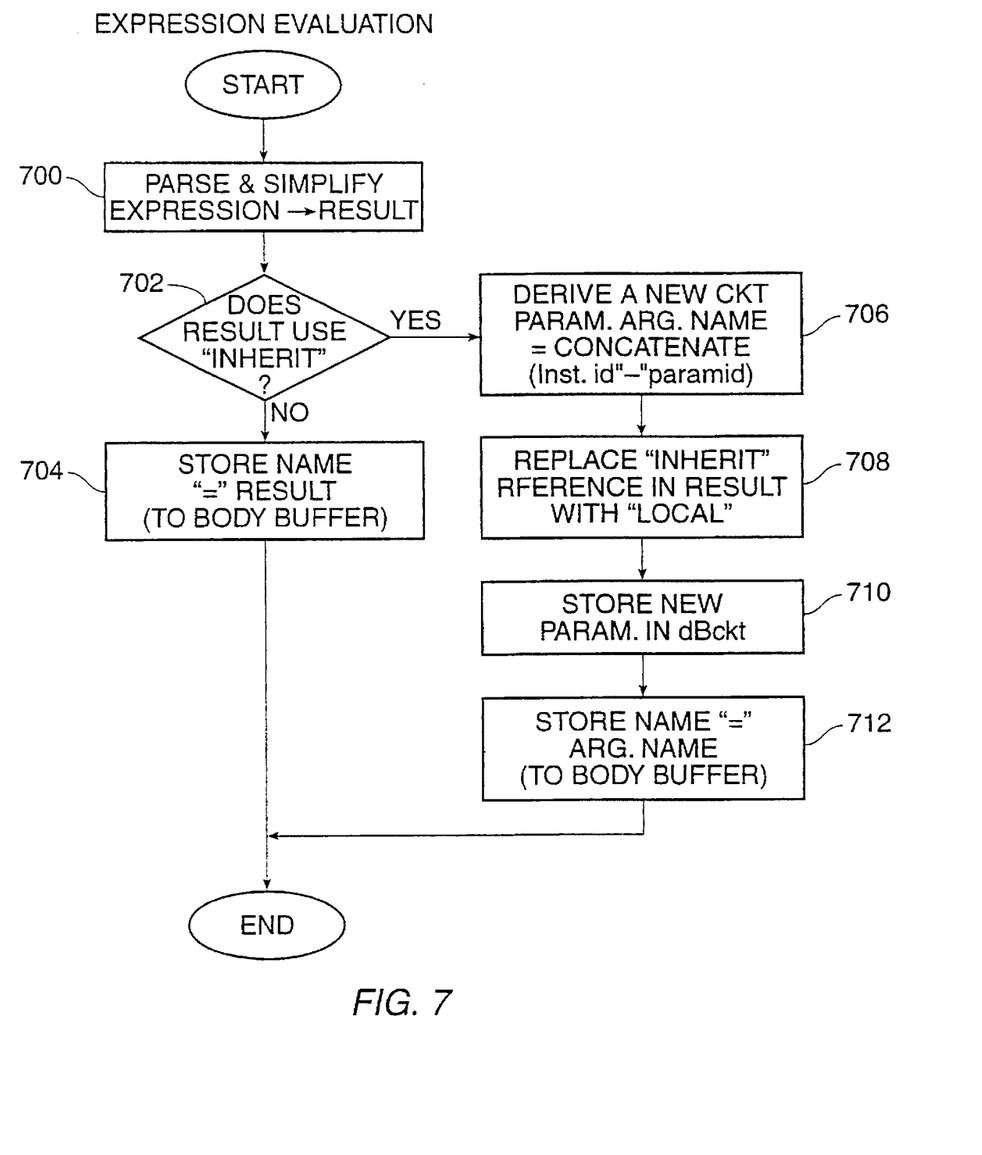
FIG. 7 is a flow diagram of an expression evaluation module of the embodiment shown in FIG. 2.

The operation of expression evaluation module 212 is illustrated by the flow diagram of FIG. 7. Using the temporary parameter lookup table, expression evaluation module 212 first parses and simplifies the expression (step 700). It then examines the simplified expression to determine whether there exists variables referencing properties of another instance at a higher level of hierarchy. That is, module 212 looks for the terminology "INHERIT" in the simplified expression (step 702). If the expression does not contain the term "INHERIT," then it can be fully evaluated and the result is placed in a "body" buffer (step 704) before it is entered into the body of the netlist defining the sub-circuit. If the expression contains an "INHERIT" term, the module 212 derives a new circuit parameter argument token by concatenating the identifiers for the parameter (step 706). An example of an argument token, found in the example shown in FIGS. 1A and 1B, is X4_R2_r which equals [INHERIT(C)+2.0+2.0]. The module replaces the term "INHERIT" with its local value (step 708) resulting in X4_R2_r=LOCAL(C)+2.0+2.0. The new argument token is stored in derived database 214 (step 710), and written into the body buffer 216 (step 712), before being entered into the netlist.

Figure 8:
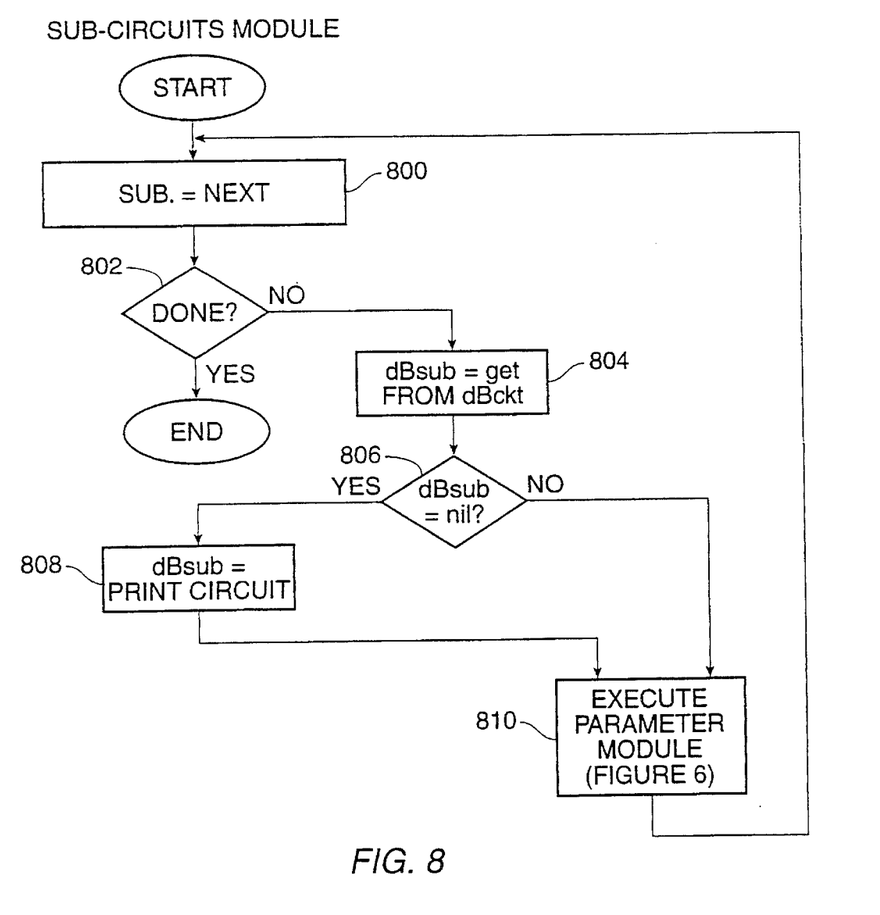
FIG. 8 is a flow diagram of a sub-circuit module of the embodiment shown in FIG. 2.

Referring to FIG. 4, after circuit module 204 processes all primitives (step 402), it executes sub-circuits module 206 (step 404). FIG. 8 is a flow diagram showing the operation of sub-circuits module 206. Sub-circuit module 206 goes through the list of instances of sub-circuits (step 800). For each instance, module 206 accesses derived database 214 to obtain the sub-circuit definition (step 804). If one does not exist (step 806), then module 206 creates the definition dBsub-ckt (step 808) and executes parameter module (step 810) before going to the next sub-circuit. Once all sub-circuit instances have been processed (step 802), the module returns to circuit module 204. Referring back to FIG. 4, at this point all primitives and sub-circuits have entered the netlist with the appropriate header and footer. The result is a compact hierarchical netlist, a textual example of which is shown in FIG. 1B.

In conclusion, the present invention provides a method and a tool for generating hierarchical netlists for circuits having instances with properties defined by algebraic expressions. The present invention avoids duplication of instance definitions using a method of expression promotion, whereby expressions are replaced by tokens in the netlist, and moved up the hierarchy to a level where they can be fully evaluated. The present invention also provides a specific embodiment for the tool implementing the expression promotion method used for netlisting.

While the above is a complete description of the method of the present invention, and an embodiment for implementing the same, it is possible to use various alternatives, modifications and equivalents. For example, there are a number of different possible approaches to implementing the netlisting method of the present invention, only one of which is fully described. Therefore, the scope of the present invention should not be determined by the above description, and should, instead, be determined with reference to the appended claims, along with their full scope of equivalents.

What is claimed is:

1. In a computer aided design system capable of simple parameter passing, a method for generating a hierarchical netlist for a circuit schematic hierarchically diagramed from a leaf level to a top level, the method comprising machine executed steps of:

(a) starting from the leaf level;

(b) identifying all components having property values defined by algebraic expressions which contain references to variables defined at a higher level in the hierarchy;

(c) gathering all occurrences of said algebraic expressions in a list;

(d) replacing each algebraic expression in a line in the hierarchical netlist with a macro argument token, said token identifying an associated member of said list;

(e) evaluating an expression when said expression does not contain references to a variable on a higher level of hierarchy;

(f) moving up the hierarchy to a parent level above the leaf level, and repeating steps (b) through (e) until all expressions have been evaluated.

2. The method of claim 1 further comprising the steps of:

(g) dividing all circuit components into primitives and sub-circuits; and (h) defining each sub-circuit by circuit components contained in said sub-circuit and corresponding values for said circuit components.

3. In a computer aided design system capable of simple parameter passing, a netlister for generating hierarchical netlists for a circuit design database having instance property values defined by algebraic expressions, the netlister comprising:

a design module, coupled to receive the circuit design database, for generating the hierarchical netlist;

a circuit module, coupled to said design module, for defining circuit instances;

a derived database, coupled to said design module and said circuit module, for storing circuit information derived from the circuit design database;

an instance module, coupled to said circuit module, for deriving circuit instance information;

a parameter module, coupled to said instance module, for deriving instance parameters; and an expression evaluation module, coupled to said parameter module and said derived database, for evaluating parameter values.

4. The netlister of claim 3 wherein the instance module comprises:

a sub-circuits module, coupled to said circuit module and parameter module, for defining sub-circuits; and a primitives module, coupled to said circuit module and parameter module, for defining primitives.

5. The netlister of claim 3 wherein the hierarchical netlist is in textual format.

6. The netlister of claim 3 wherein the hierarchical netlist is in binary format.

\* \* \* \* \*